United States Patent
Lusky et al.

(10) Patent No.: US 8,248,855 B2
(45) Date of Patent: Aug. 21, 2012

(54) METHOD OF HANDLING REFERENCE CELLS IN NVM ARRAYS

(75) Inventors: Eli Lusky, Tel Aviv (IL); Aner Arussi, Alfei-Menashe (IL); Amir Gabai, Alfei-Menashe (IL)

(73) Assignee: Infinite Memories Ltd., Park Afek Rosh Ha'ayin (IL)

( * ) Notice: Subject to any disclaimer, the term of this patent is extended or adjusted under 35 U.S.C. 154(b) by 294 days.

(21) Appl. No.: 12/720,687

(22) Filed: Mar. 10, 2010

(65) Prior Publication Data

US 2011/0222338 A1   Sep. 15, 2011

(51) Int. Cl.
  *G11C 11/34* (2006.01)
(52) U.S. Cl. ............. 365/185.2; 365/185.24; 365/210.1
(58) Field of Classification Search ................ None
  See application file for complete search history.

(56) References Cited

U.S. PATENT DOCUMENTS

| 7,020,037 B2* | 3/2006 | Anzai et al. ............... 365/210.1 |
| 7,123,532 B2* | 10/2006 | Lusky et al. ............... 365/210.1 |
| 7,257,025 B2 | 8/2007 | Maayan |
| 2002/0030526 A1 | 3/2002 | McClure et al. |
| 2003/0142547 A1 | 7/2003 | Micheloni et al. |
| 2003/0161188 A1 | 8/2003 | Takahashi et al. |
| 2006/0274583 A1 | 12/2006 | Lutze |
| 2009/0086539 A1 | 4/2009 | Aritome |

* cited by examiner

*Primary Examiner* — Alexander Sofocleous
(74) *Attorney, Agent, or Firm* — Daniel J. Swirsky; AlphaPatent Associates Ltd.

(57) ABSTRACT

A memory chip includes memory cells storing data to be read, at least one reference cell having a reference cell current level, at least one reference gate voltage memory cell storing a reference gate voltage value and a read circuit to read the memory cells with a fixed gate voltage with respect to at least one reference cell activated at a voltage having its associated stored reference gate voltage value.

14 Claims, 7 Drawing Sheets

METHOD OF HANDLING REFERENCE CELLS IN NVM ARRAYS

FIELD OF THE INVENTION

The present invention relates to non-volatile memories generally and to correcting cell current shift in particular.

BACKGROUND OF THE INVENTION

Non-volatile memory arrays store information in a memory cell by charging the cell, thereby changing the threshold voltage (Vt) level of the cell, where the threshold voltage is the gate voltage at which current begins to flow across the cell. The state of the stored bit indicates the state of the charge, where a charged cell is programmed and an uncharged cell is unprogrammed. When a sufficiently large voltage is applied to the gate of the memory cell, current will flow if the cell is not programmed but it will not flow if the cell is programmed.

Typically, the state of the cell is sensed by measuring the amount of cell current compared to that of a programmed reference cell when a gate voltage is applied. For a single level memory array, if the cell current is below that of the programmed reference cell (i.e. the cell is programmed), the cell is said to store a first value while if the cell current is above that of the reference cell, the cell is said to store a second value.

FIG. 1, to which reference is now made, illustrates the distribution of cell currents for an array of multi-level cells when a gate voltage GV is applied. In multi-level cells, the amount of charge to be stored varies according to which state is to be represented. For cells with 4 levels, 2 bits may be stored, where each level represents one of the four states. Thus, FIG. 1 shows four curves, each representing one of the four states. The first curve illustrates the distribution 10 of cell currents among the cells of the array, before any of them are programmed. This is called the "native distribution", with the lowest threshold voltage levels and the highest cell current. The second curve shows the distribution 12 after programming to a first level, the third curve shows the distribution 14 after programming to a second level and the fourth curve shows the distribution 16 after programming to a third level. Note that distributions 12, 14 and 16 have widths $W_i$, which are very similar, while distribution 10 has width $W_0$, which is typically wider.

The memory chip may have three reference cells, each set at a different level between the distributions. Thus, one reference cell may be programmed to have a reference cell current $I_{REF1}$ between distribution 10 and distribution 12, the second reference cell may have a reference cell current $I_{REF2}$ between distribution 12 and distribution 14, and the third reference cell may have a reference cell current $I_{REF3}$ between distribution 14 and distribution 16. The reference cell currents may be set to maintain margins MxA above a lower distribution and MxB below an upper distribution. For example, margin M2A is set to be above distribution 12 while M2B is below distribution 14. The distance between any two reference cell current levels may be the width of the distribution plus the width of its two margins.

For some types of chips, the cell current level of the first reference cell may be set according to the native distribution while the cell current levels of the remaining reference cells may be set to be a fixed amount below the first reference cell current level.

For reading, a gate voltage GV is provided to the gates of the memory cell to be read and to the gates of the reference cells. The output of the memory cell is compared to the output of each reference cell. If the memory cell is programmed to the highest level, its cell current is the lowest. As a result, the current output of all the reference cells will be larger than the current output of the cell. Similarly, if the memory cell is not programmed, none of the reference cells will provide a higher output current. The other states can also be determined.

SUMMARY OF THE PRESENT INVENTION

There is provided, in accordance with a preferred embodiment of the present invention, a memory chip including memory cells storing data to be read, at least one reference cell having a reference cell current level, at least one reference gate voltage memory cell storing a reference gate voltage value and a read circuit. The read circuit reads the memory cells with a fixed gate voltage with respect to at least one reference cell activated at a voltage having its associated stored reference gate voltage value Further, in accordance with a preferred embodiment of the present invention, the chip includes a reference gate voltage determiner to determine, for each the reference cell, a difference between a shifted reference cell current level and an initial state and sets the reference gate voltage value as a function of the difference.

Still further, in accordance with a preferred embodiment of the present invention, the reference gate voltage determiner includes a unit to change the reference gate voltage level from the fixed gate voltage level in steps and to stop changing the reference gate voltage level when a predefined margin has been achieved.

Additionally, in accordance with a preferred embodiment of the present invention, the memory cells are one-time programmable cells. Alternatively, they are programmable and/or erasable cells. In a further embodiment, the memory cells are multi-level cells and they can be of 4, 8 or 16 levels.

Alternatively, in accordance with a preferred embodiment of the present invention, the chip also includes a reference gate voltage determiner to determine a difference between a shifted reference cell current level and an edge of a distribution of cell currents and to set the reference gate voltage value as a function of the difference.

There is also provided, in accordance with a preferred embodiment of the present invention, a memory chip including memory cells storing data to be read, at least one reference cell having a reference cell current level and a reference gate voltage adjuster to adjust, for each reference cell, a reference gate voltage level to compensate for a shift of the reference cell current level from an original current level.

Moreover, in accordance with a preferred embodiment of the present invention, the reference gate voltage adjuster includes a unit to change the reference gate voltage level from an original reference gate voltage level in steps and to stop changing the reference gate voltage level when a predefined margin is achieved.

Further, in accordance with a preferred embodiment of the present invention, the unit operates on a representative distribution.

Still further, in accordance with a preferred embodiment of the present invention, the unit determines a difference between the original reference gate voltage level and a resultant reference gate voltage level and the adjuster adds the difference to a fixed gate voltage used by the chip for reading.

Moreover, in accordance with a preferred embodiment of the present invention, the margin is defined with respect to an associated distribution.

There is further provided, in accordance with a preferred embodiment of the present invention, a method for reading a memory chip. The method includes reading one or more reference gate voltage memory cells for reference gate voltage values stored therein, providing a fixed gate voltage to at least one memory cell to be read, providing reference gate voltages at the reference gate voltage values to associated reference cells when reading at least one memory cell and comparing the output of the at least one memory cell with the output of the reference cells.

Additionally, in accordance with a preferred embodiment of the present invention, the method includes determining, for each the reference cell, a difference between a shifted reference cell current level and an initial state and setting the reference gate voltage value as a function of the difference.

Further, in accordance with a preferred embodiment of the present invention, the determining includes changing the reference gate voltage level from the fixed gate voltage level in steps and stopping to change the reference gate voltage level when a predefined margin is achieved.

Moreover, in accordance with a preferred embodiment of the present invention, the method includes determining, for each the reference gate voltage cell, a difference between a shifted reference cell current level and an edge of a distribution of cell currents and setting the reference gate voltage value as a function of the difference.

There is also provided, in accordance with a preferred embodiment of the present invention, a method for a memory chip. The method includes adjusting, for each reference cell of the memory chip, a reference gate voltage level to compensate for a shift of a reference cell current level from an original current level.

Moreover, in accordance with a preferred embodiment of the present invention, the adjusting includes changing the reference gate voltage level from the fixed gate voltage level in steps and stopping to change the reference gate voltage level when a predefined margin is achieved.

Further, in accordance with a preferred embodiment of the present invention, the changing includes determining a difference between said original reference gate voltage level and a resultant reference gate voltage level and wherein said adjusting comprises adding said difference to a fixed gate voltage used by said chip for reading.

Still further, in accordance with a preferred embodiment of the present invention the determining uses a representative distribution as a reference to detect change in reference cell current.

Finally, in accordance with a preferred embodiment of the present invention, the memory cells can be multi-level cells or single level cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
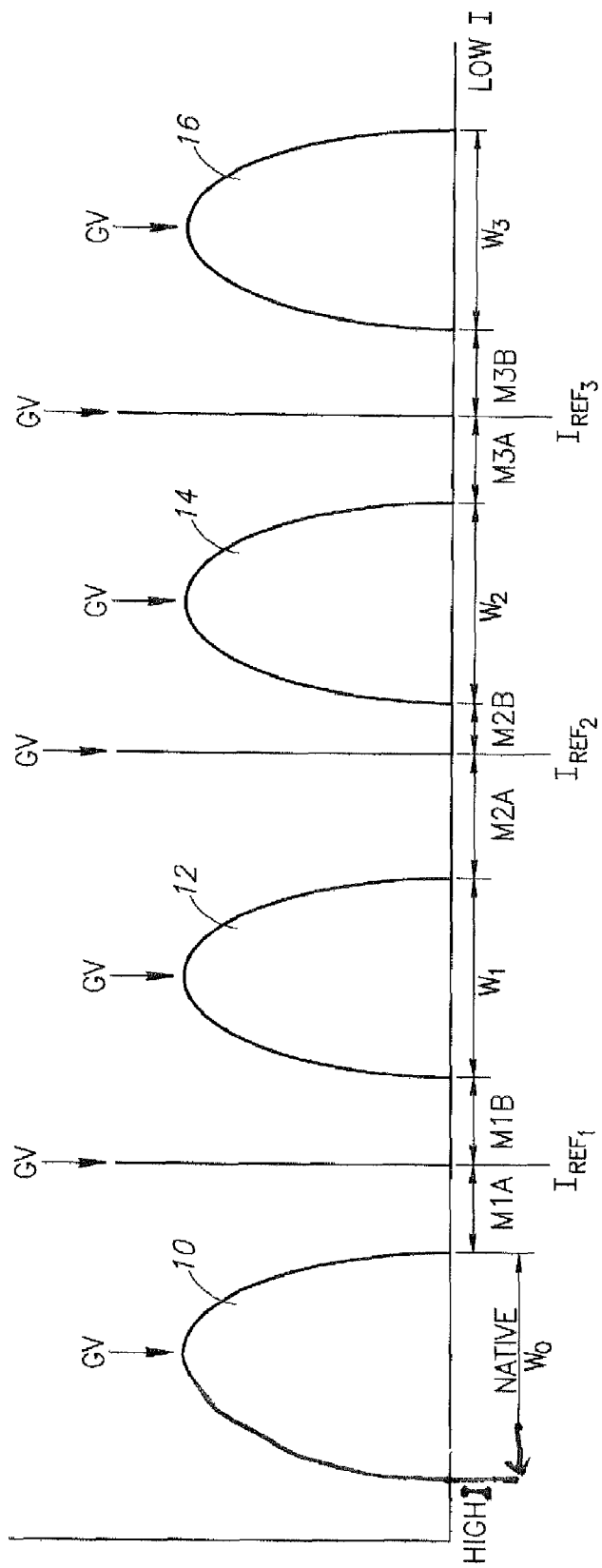
FIG. 1 is a schematic illustration of exemplary distributions of cell current for a given gate voltage for the memory cells and reference cells of a four state memory array.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Non-volatile memory cells may retain their information bits using trapped charge in a trapping domain, such as a floating gate or an ONO (oxide-nitride-oxide) layer. Typically in these devices, discharge effects are observed, resulting in cell current change. This is a known fact for erasable and programmable memory cells. Applicants have realized that it is of particular importance for the reference cells of multi-level cells, since each one, by itself, defines one edge of a margin. If the reference cell current moves, then the margin grows or shrinks. Controlling the reference cell current is, then, of great importance to maintaining margins of a desired size.

Typically, the reference cell currents are set when the chip is first manufactured, typically by programming each reference cell to a level of charge that will provide the desired cell current. Unfortunately, after the reference cell currents are set, there are additional manufacturing steps, such as wafer polishing and die packaging, which can also affect the states of the cells of the chip. For example, mechanical stress is a non-limiting example. Thus, upon first power up, first programming of the array or upon any other operation of the die, it is possible that the reference cell currents may be different than originally set. This is true for erasable and programmable cells as well as for one-time programmable cells, which cells are programmed once and, after that, are not changeable.

Figure 2:
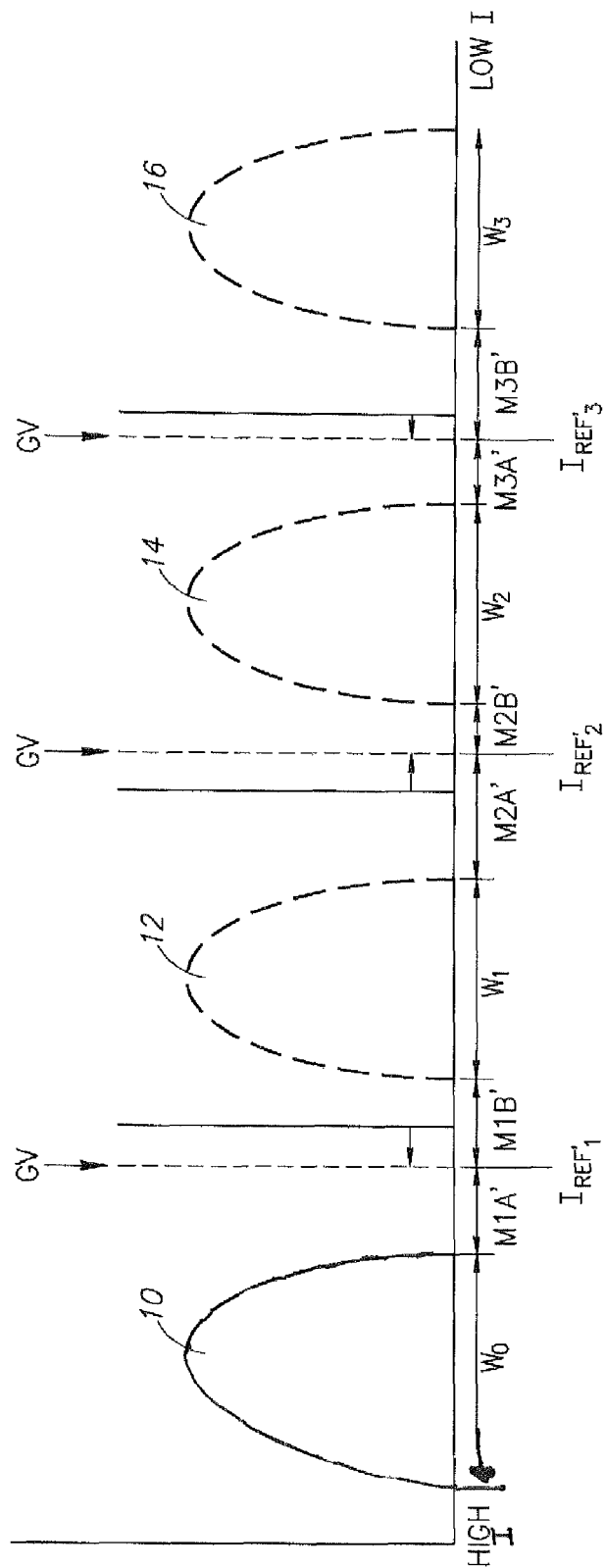
FIG. 2 is a schematic illustration of the distributions of memory and reference cell current for the memory array of FIG. 1 after manufacturing.

Reference is now made to FIG. 2, which illustrates the state after manufacturing, for a one-time programmable chip. Distributions 12, 14 and 16 are not yet formed as no cells have yet been programmed. However, for illustration, they are shown where they are designed to be, but with dashed lines. Unfortunately, the reference cell currents, of the three reference cells, shown with dashed lines, have moved from their designed levels. The reference cell currents $I_{REF1}$ and $I_{REF3}$ of the first and third reference cells have moved to the left, to $I_{REF1}'$ and $I_{REF3}'$, respectively, while reference cell current $I_{REF2}$ has moved to the right, to $I_{REF2}'$. In fact, in FIG. 2, second reference cell current $I_{REF2}'$ is shown closer than planned to $I_{REF3}'$, hence, margins M2B' and M3A' may be much too small to be useful. As a result, the chip of FIG. 2 may not be functional.

Applicants have realized that, in order for the array not to be inoperable, the reference cells margins have to be changed. Applicants have further realized that a simple way to make such a change, that does not require reprogramming the reference cells or having multiple reference cells with multiple cell current levels to choose from, may be to change the gate voltage level with which the reference cells are read.

Figure 3:
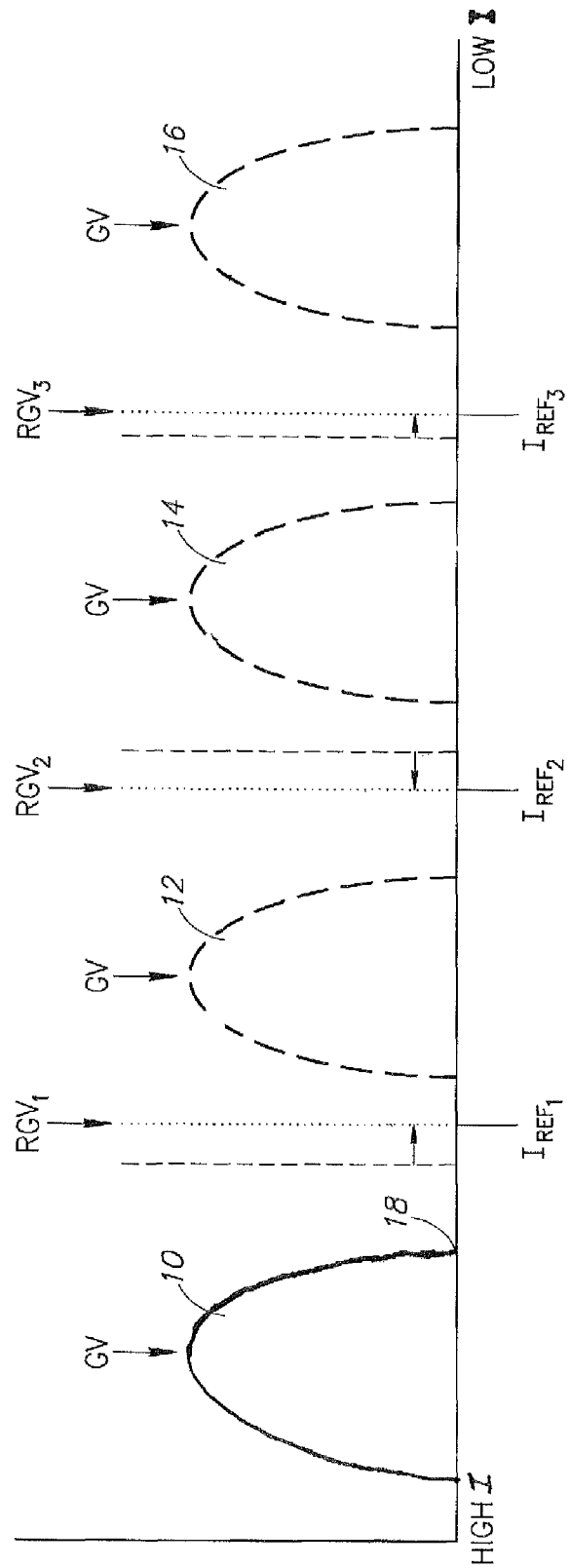
FIG. 3 is a schematic illustration of a correction to the reference cell current, in accordance with a preferred embodiment of the present invention.

FIG. 3, to which reference is now made, shows the same distributions 10, 12, 14 and 16 as in FIG. 2. However, in accordance with a preferred embodiment of the present invention, the gate voltages with which the reference cells are read may be changed to provide more acceptable margins, while the memory cells may continue to be read with the standard gate voltage GV. Thus, in the example of FIGS. 2 and 3, since reference cell current $I_{REF1}'$ of the first reference cell has increased, the first reference cell may be read with a gate voltage $RGV_1$ which is lower than the standard gate voltage GV. The second reference cell may be read with a gate voltage higher than the standard gate voltage GV, in order to increase $I_{REF2}'$. The third reference cell may be read with a lower gate voltage $RGV_3$, which may be the same or different than $RGV_1$, depending on how much each of the cell currents have moved.

In general, the gate voltages may be adjusted to compensate for the change in the reference cell currents such that the sensing current of the reference cell returns to or is close to their originally designed levels.

It will be appreciated that, by reading the reference cells each with its own reference gate voltage, the movement of the reference cell currents may be countered or minimized. As a result of the changed gate voltages, the size of the margins is changed (as well as of the distance between reference cell current levels), ideally back to or close to their original sizes.

In another embodiment, the reference cell currents may be related to each other. Thus, $I_{REF1}$ may be set to be at a certain level which may be a certain margin to the right of the expected rightmost tail (point 18) of native distribution 10, $I_{REF2}$ may be set to be a certain cell current level to the right of $I_{REF1}$, and $I_{REF3}$ may be set to be a certain cell current level to the right of $I_{REF2}$ by changing their gate voltages.

Figure 4:
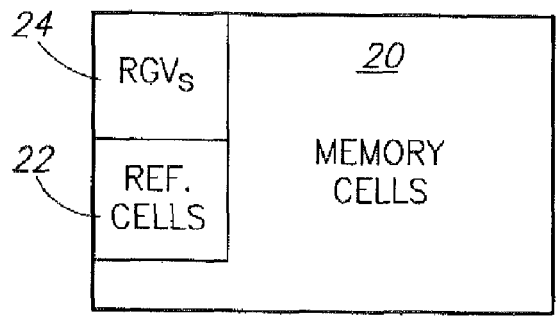
FIG. 4 is a schematic illustration of a memory array, constructed and operative in accordance with a preferred embodiment of the present invention.

In accordance with a preferred embodiment of the present invention and as illustrated in FIG. 4, to which reference is now made, the chip may comprise, in addition to a large section 20 of the array for the memory cells and a small section 22 of the array for the reference cells, a further section 24 storing reference cell gate voltages ($RGV_i$) or storing the individual changes (or deltas) above or below the standard gate voltage which corrects the reference cell current levels back close to the desired levels.

To generate the initial set of reference cell current levels, the chip may select at least one page of the memory in the native distribution and may select a point which is assumed to be stable within that distribution to define an "anchor point". An embedded program of the memory chip may measure the distance between the anchor point and the first reference cell current level $I_{REF1}$. $I_{REF2}$ and $I_{REF3}$ may be set at predefined locations with respect to $I_{REF1}$, which may be defined by the width of the relevant distributions plus the widths of the relevant margins.

Figure 5:
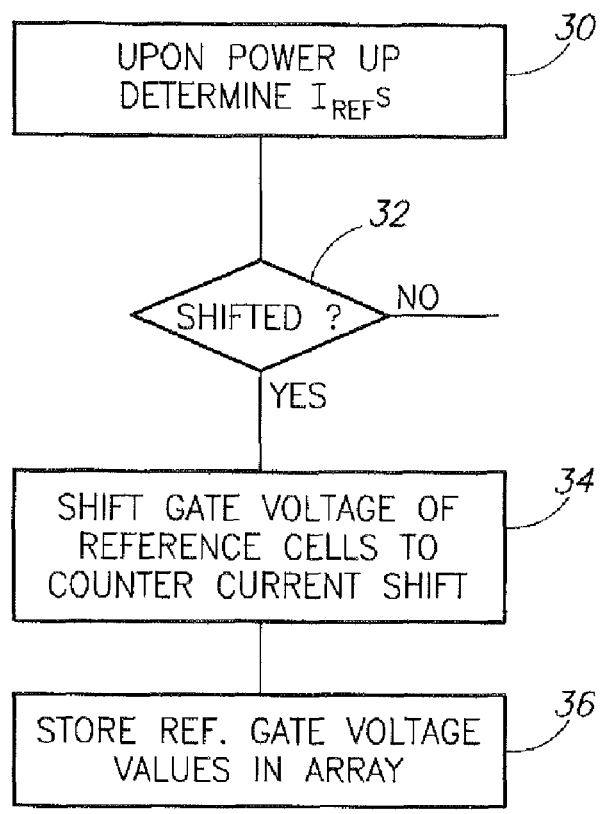
FIG. 5 is a flow chart illustration of a method of countering shift in the current of reference cells, constructed and operative in accordance with a preferred embodiment of the present invention.

Reference is now made to FIG. 5, which illustrates an example of a method for determining the appropriate reference gate voltages ($RGV_i$) for the reference cells. Upon power up or first program operation or any other operation mode of the die, the chip may determine (step 30) the cell currents $I_{REFi}$ of the reference cells and may compare them to information, stored somewhere on the chip, about the desired reference cell currents.

If the reference cell currents $I_{REFi}$ have shifted, as tested in step 32, the chip may determine (step 34) new gate voltage $RGVi$ levels for the reference cells, as described hereinbelow, and, in accordance with a preferred embodiment of the present invention, may change the gate voltages to those which will provide the predetermined sensing current.

Once the new reference gate voltages have been determined, their values may be stored (step 36) in reserved section 24 of the memory array. Alternatively, the correction, above or below the standard gate voltage GV, may be stored.

For step 34, the chip may determine the gate voltages by first determining the cell current difference $D_i$ between the current cell current $I_{REFi}'$ and the desired cell current $I_{REFi}$. The new gate voltage $RGV_i$ may then be determined by changing the standard gate voltage GV up or down by $D_i$. As mentioned hereinabove, $D_i$ may be stored.

An exemplary implementation of the above method may be: The chip may program a representative page from within the array to have a representative version of the array distributions and may define a search point X for the representative distribution. For example, X may be 2000 bits.

Initially, the chip may program the reference cell and may determine the reference gate voltage for which all of the X bits of the representative distribution are read properly. This reference gate voltage is then stored.

When the chip wants to determine the appropriate reference gate voltages, it may activate the reference cells with the stored reference gate voltage and may determine how many of the X bits failed (i.e. produced the wrong read output). The chip may increase or decrease the relevant reference gate value RGV, typically by 0.05V at a time, and may check, after each change, how many of the X bits failed with the new reference gate value. Once no bits fail, the reference gate value has moved the reference cell current level sufficiently. The resultant value may be compared to the original stored value and the difference may be stored. The operating gate voltage RGV is then determined by adding the stored difference to the fixed gate voltage value which is used for reading the regular cells of the array.

Figure 6:
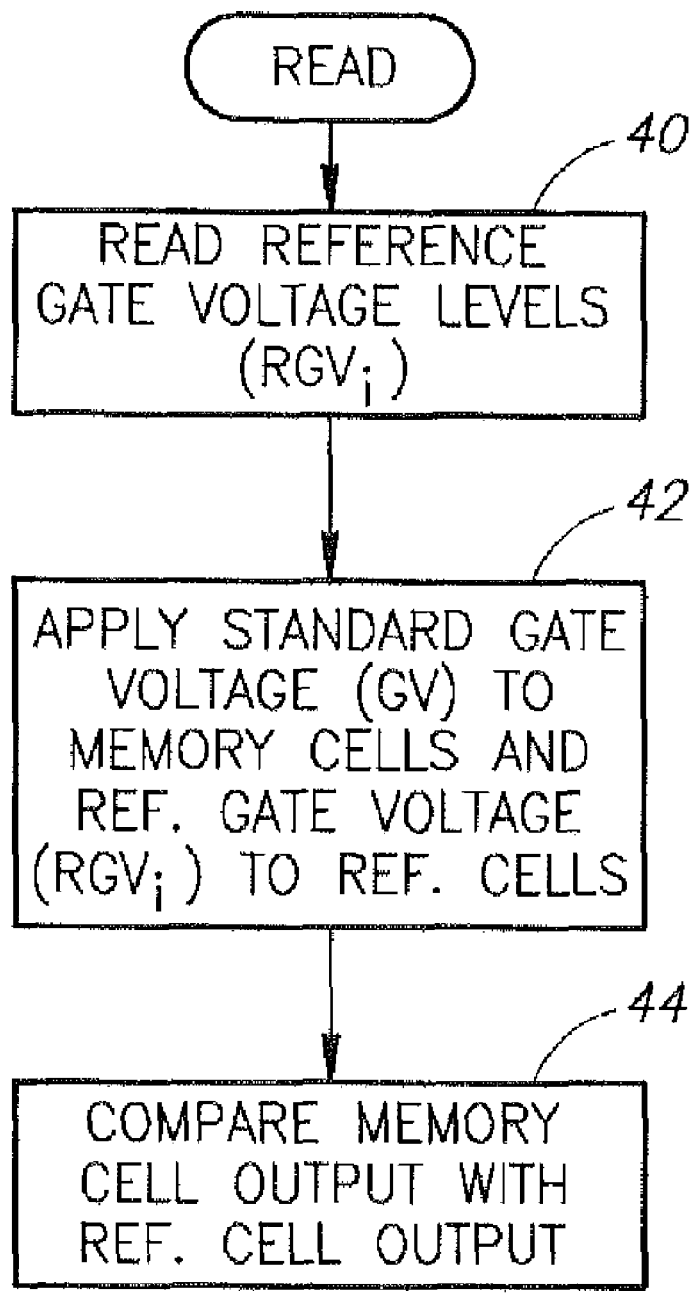
FIG. 6 is flow chart illustration of a method of reading memory cells, in accordance with a preferred embodiment of the present invention.

Reference is now made to FIG. 6, which illustrates a method of reading the chip, in accordance with a preferred embodiment of the present invention. The chip may first read (step 40) reserved section 24 for the reference gate voltages $RGV_i$. To read a memory cell, the chip may activate (step 42) the gates of the reference cells with the read reference gate voltages and the gates of the selected memory cells with the standard gate voltage GV. To read the output, the current output of the reference cells may be compared (step 44) with the current output of the memory cells.

It will be appreciated that the present method may also be utilized for programmable and/or erasable arrays.

Figure 7A:
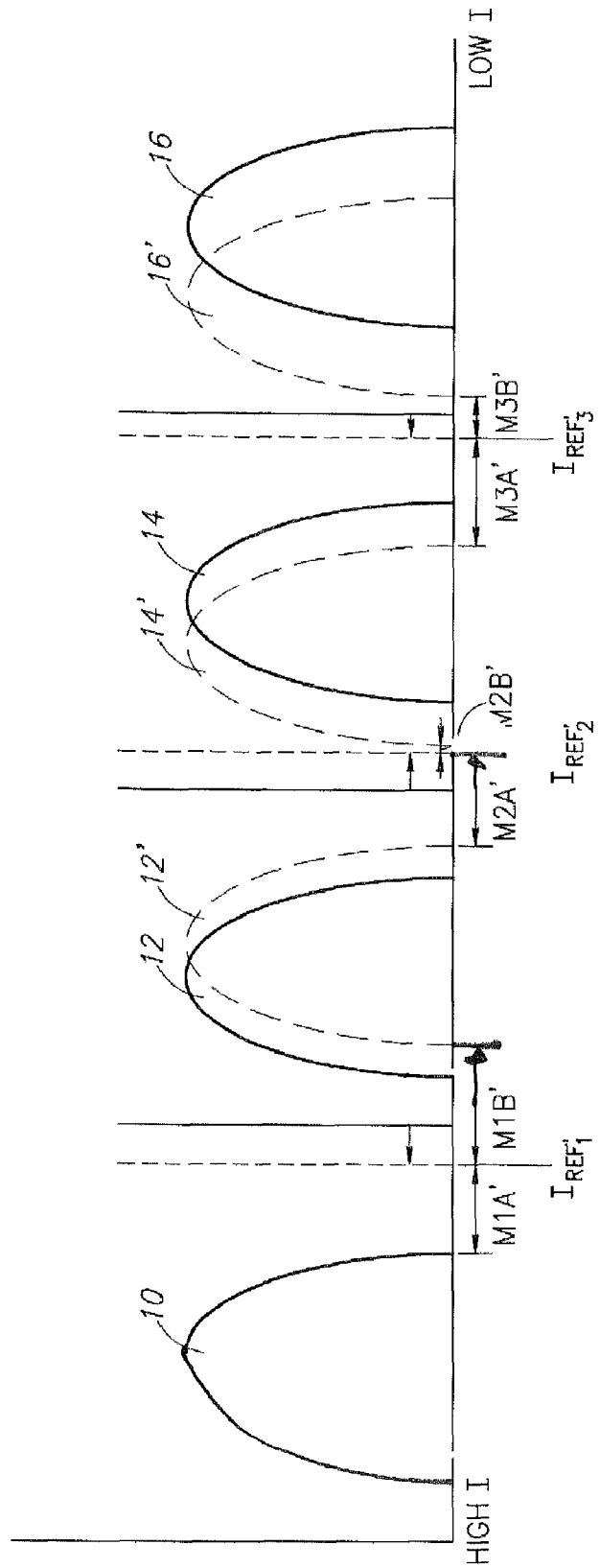
FIGS. 7A and 7B are schematic illustrations of the distributions of memory and reference cell currents in multi-state arrays which allow programming and erasing before and after correction for shift in the reference cell currents, respectively.

Reference is now made to FIG. 7A which illustrates an exemplary cell current distribution wherein, not only are the reference cells not stable, but the array cells are also not stable and their cell currents $I_{cell}$ may shift with time. FIG. 7A illustrates the four original distributions 10, 12, 14 and 16 as well as the distributions after a period of time (marked by 's). While the native distribution 10 does not change, each of the programmed distributions does. Second distribution 12 has moved upward, becoming distribution 12', while third and fourth distributions 14 and 16 have moved downward, becoming distributions 14' and 16'.

Moreover, FIG. 7A shows the change in the reference cell currents. In this example, the reference cell currents have changed in the same way as in FIG. 2. Thus, the reference cell currents $I_{REF1}$ and $I_{REF3}$ of the first and third reference cells have moved downward, to $I_{REF1}'$ and $I_{REF3}'$, respectively, while the reference cell current $I_{REF2}$ has moved upward, to $I_{REF2}'$.

Between the movements of the distributions and the movements of the reference cell currents, some of the margins in FIG. 7A (margin M2B' in particular) are so small that the chip is non-functional. As can be seen, only margin M1B has expanded; the remaining margins have been reduced.

Figure 7B:
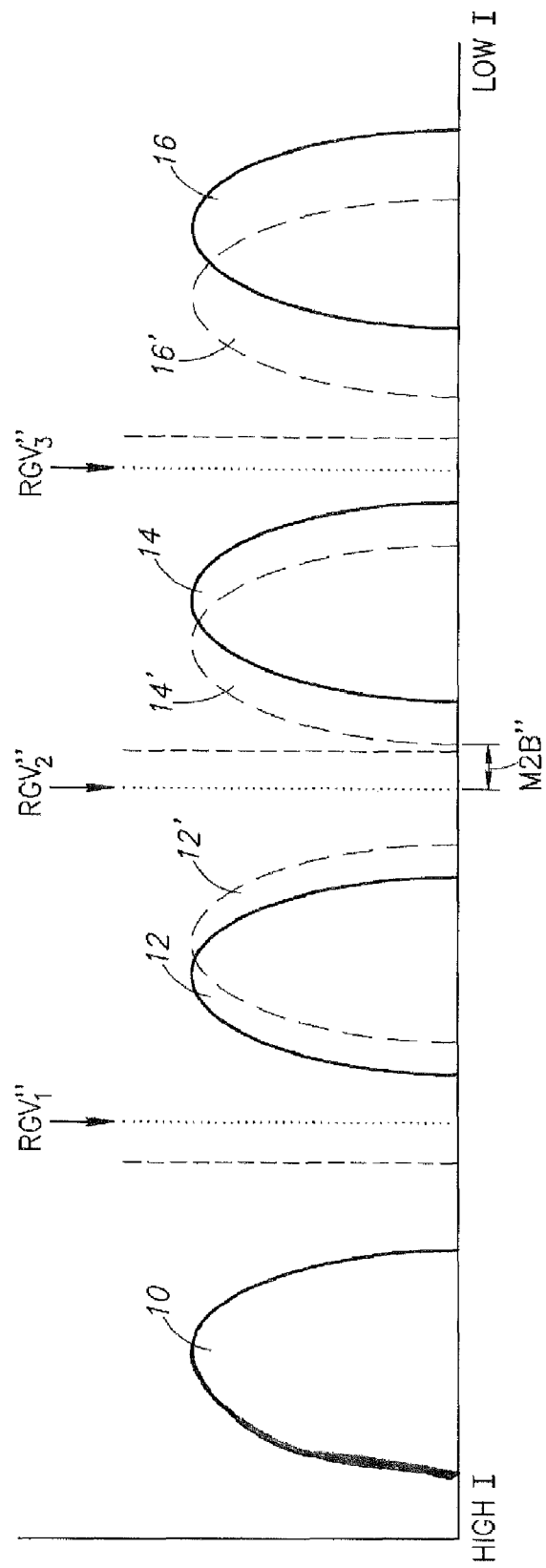

In this example, to accommodate the change in distribution and the changes in the reference cells, all of the reference cell currents should be moved. An exemplary solution is shown in FIG. 7B, to which reference is now made, where the reference cell currents are moved to provide as large a margin as possible above the distribution below it. In particular, note the margin labeled M2B"—it is now sufficiently large. The reference cell currents may be moved by first determining the current level at an edge of each distribution 10, 12', 14' and 16'. Then, a difference may be determined between the shifted, incorrect, reference cell current level and the edge current level. The reference gate voltage value may be set as a function of the difference.

It will be appreciated that the above discussion considered reference cells which were programmed to the desired cell current levels. Applicants have realized that it is also possible not to program the reference cells at all and, instead, to provide separate reference gate voltages to the reference cells, thereby to provide separate reference cell current levels.

For example, if the standard array gate voltage is 5.4V, then the reference gate voltages might be 6.0V, 6.7V and 7.4V, where a gate voltage of 6.0V may provide the third reference cell current level $I_{REF3}$, 6.7V may provide the second reference cell current level $I_{REF2}$, and 7.4V may provide the first reference cell current level $I_{REF1}$. The initial, separate reference gate voltage levels may be stored in reserved section 24 of FIG. 4.

Furthermore, the reference cell currents of the unprogrammed reference cells may change during the polishing and packaging processes, even if the native distribution does not significantly change. Accordingly, the correction described hereinabove may also be implemented and any changes to the gate voltage levels may also be stored in reserved section 24.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A memory chip comprising:
    memory cells storing data to be read;
    at least one reference cell having a reference cell current level;
    at least one reference gate voltage memory cell storing a reference gate voltage value; and
    a read circuit to read said memory cells with a fixed gate voltage with respect to at least one reference cell activated at a voltage having its associated said stored reference gate voltage value.

2. The memory chip according to claim 1 and also comprising a reference gate voltage determiner to determine, for each said reference cell, a difference between a shifted reference cell current level and an initial state and to set said reference gate voltage value as a function of said difference.

3. The memory chip according to claim 2 and wherein said reference gate voltage determiner comprises a unit to change said reference gate voltage level from said fixed gate voltage level in steps and to stop changing said reference gate voltage level when a predefined margin has been achieved.

4. The memory chip according to claim 1 and wherein said memory cells are one-time programmable cells.

5. The memory chip according to claim 1 and wherein said memory cells are multi-level cells.

6. The memory chip according to claim 5 and wherein said multi-levels are 4 levels.

7. The memory chip according to claim 5 and wherein said multi-levels are 8 levels.

8. The memory chip according to claim 5 and wherein said multi-levels are 16 levels.

9. The memory chip according to claim 1 and also comprising a reference gate voltage determiner to determine a difference between a shifted reference cell current level and an edge of a distribution of cell currents and to set said reference gate voltage value as a function of said difference.

10. The memory array according to claim 2 and wherein said memory cells are programmable and erasable cells.

11. A method for reading a memory array, the method comprising:
    reading one or more reference gate voltage memory cells for reference gate voltage values stored therein;
    providing a fixed gate voltage to at least one memory cell to be read;
    providing reference gate voltages at said reference gate voltage values to associated reference cells when reading said at least one memory cell to be read; and
    comparing the output of said at least one memory cell to be read with the output of said reference cells.

12. The method according to claim 11 and also comprising determining, for each said reference cell, a difference between a shifted reference cell current level and an initial state and setting said reference gate voltage value as a function of said difference.

13. The method according to claim 12 and wherein said determining comprises changing said reference gate voltage level from said fixed gate voltage level in steps and stopping to change said reference gate voltage level when a predefined margin is achieved.

14. The method according to claim 11 and also comprising determining, for each said reference gate voltage cell, a difference between a shifted reference cell current level and an edge of a distribution of cell currents and setting said reference gate voltage value as a function of said difference.

* * * * *